US012683420B2

(12) United States Patent
Kroener et al.

(10) Patent No.: US 12,683,420 B2
(45) Date of Patent: Jul. 14, 2026

(54) METHOD AND DEVICE FOR CARRYING OUT A PROCESS FOR CHARGING AN APPLIANCE BATTERY

(71) Applicant: Robert Bosch GmbH, Stuttgart (DE)

(72) Inventors: Christoph Kroener, Freiberg Am Neckar (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 939 days.

(21) Appl. No.: 17/887,679

(22) Filed: Aug. 15, 2022

(65) Prior Publication Data

US 2023/0046787 A1     Feb. 16, 2023

(30) Foreign Application Priority Data

Aug. 16, 2021     (DE) .................... 10 2021 208 937.2

(51) Int. Cl.
H02J 7/90          (2026.01)
B60L 53/62        (2019.01)
          (Continued)

(52) U.S. Cl.
CPC .............. H02J 7/933 (2026.01); B60L 58/16 (2019.02); G01R 31/392 (2019.01);
          (Continued)

(58) Field of Classification Search
CPC ...... H02J 7/00712; H02J 7/0048; H02J 7/005; H02J 7/007; H02J 7/00714; B60L 58/16;
          (Continued)

(56) References Cited

U.S. PATENT DOCUMENTS

2012/0161698 A1*   6/2012   Anderson ........... H02J 7/00712
                                                            320/109
2015/0326037 A1   11/2015   Borhan et al.
                    (Continued)

FOREIGN PATENT DOCUMENTS

DE        102018203824 A1     9/2019
DE        102019108607 B3     10/2020

OTHER PUBLICATIONS

Samson AG, "Controller and Controlled Systems", 1999 (Year: 1999).*

*Primary Examiner* — Julian D Huffman
*Assistant Examiner* — Nathan J Instone
(74) *Attorney, Agent, or Firm* — Michael Best & Friedrich LLP

(57)          ABSTRACT

A method for carrying out a process for charging an appliance battery of an appliance, with the following steps:
   providing a charging profile that specifies a maximally permissible charging current for charging the appliance battery in a manner depending on a state of charge of the appliance battery;
   ascertaining a current state of health of the appliance battery;
   providing a reference state of health that predetermines a customary state of health for a calendrical age of the appliance battery;
   charging the appliance battery in a manner depending on a corrected maximally permissible charging current, the corrected maximally permissible charging current being ascertained by applying a correction value to the maximally permissible charging current, the correction value being determined in a manner depending on a
          (Continued)

correction function, depending on a difference between the reference state of health and the current state of health.

7 Claims, 3 Drawing Sheets

(51) Int. Cl.

| | |
|---|---|
| *B60L 58/16* | (2019.01) |
| *G01R 31/392* | (2019.01) |
| *H01M 10/44* | (2006.01) |
| *H02J 7/82* | (2026.01) |
| *H02J 7/84* | (2026.01) |
| *H02J 7/94* | (2026.01) |

(52) U.S. Cl.
CPC .............. *H01M 10/44* (2013.01); *H02J 7/82* (2026.01); *H02J 7/84* (2026.01); *H02J 7/90* (2026.01); *H02J 7/94* (2026.01); *B60L 53/62* (2019.02)

(58) Field of Classification Search
CPC .......... B60L 53/62; B60L 58/18; B60L 58/30; G01R 31/392; G01R 31/396; H01M 10/44; H01M 10/441
USPC .................................................. 320/109, 162
See application file for complete search history.

(56) References Cited

U.S. PATENT DOCUMENTS

| | | | |
|---|---|---|---|
| 2016/0221465 A1* | 8/2016 | Kratzer ................. | H02J 7/0013 |
| 2022/0105829 A1* | 4/2022 | Nakagawa ........... | G01R 31/367 |
| 2024/0204548 A1* | 6/2024 | Kobayashi ............... | H02J 3/38 |

* cited by examiner

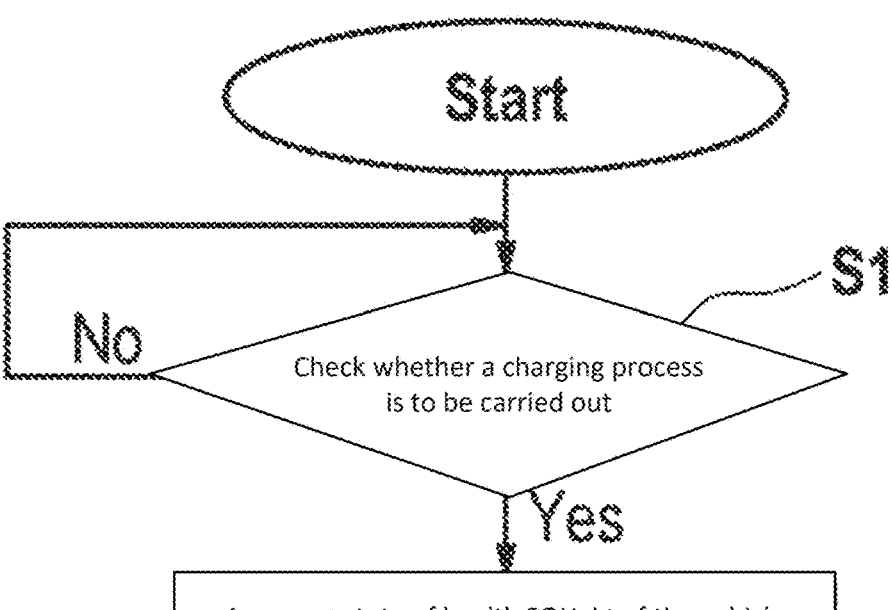

Start

No ← Check whether a charging process is to be carried out — S1

Yes

A current state of health SOHakt of the vehicle battery is ascertained in a state-of-health ascertainment block — S2

A reference state of health SOHref is predetermined by a reference-state-of-health ascertainment block — S3

Depending on a difference between the reference state of health SOHref and the current state of health SOHakt of the vehicle battery , a correction factor K is now ascertained in a correction-factor block — S4

Use correction factor in an adaptation block, in order to adapt (multiplicatively) the maximum charging currents predetermined in each instance by the predetermined charging profile L, in order to obtain a corrected charging profile Lkorr — S5

Ascertain the charging current currently to be set or a corrected maximally permissible charging current Icharg_korr on the basis of a determination of the current state of charge SOC in the respective vehicle battery in a state-of-charge ascertainment block, and set the charging current to the corrected maximally permissible charging current — S6

FIG. 2

METHOD AND DEVICE FOR CARRYING OUT A PROCESS FOR CHARGING AN APPLIANCE BATTERY

BACKGROUND

The invention relates to appliance batteries, in particular to vehicle batteries of electrically powered vehicles, and in particular to the adapting of a charging strategy for appliance batteries of such a type.

The charging of an appliance battery results in degradation. The degree of degradation depends on parameters of the charging process. The stress exerted on the appliance battery during the charging process determines its aging behavior.

As a rule, the charging of the appliance battery is carried out on the basis of a predetermined charging profile. As a rule, the charging profile is specified by a characteristic curve that determines a dependence of a charging current or, to be more precise, a maximum charging current on a state of charge. The charging profile has been established in such a way that it optimizes the charging-period, the maximum charging current and the accepted aging behavior, so that a compromise can be reached between loading of the appliance battery and the required charging-time.

Ordinarily, the charging profiles are ascertained prior to the start of production with the aid of extensive laboratory measurements, and a charging profile is created, as a result of which the dependence of the degradation on the charging current, on the battery temperature and on the state of charge of the appliance battery can be taken into account.

Since every behavior of a user places a different load on the appliance battery, the state of health is determined not solely by the calendrical aging but also by the progressions of the charging and discharging currents, of the state of charge and of the battery temperature. However, since only one charging profile is currently available for a certain type of appliance battery for normal and fast charging, the state of health of the appliance battery cannot be taken into account during the charging process.

SUMMARY

The invention provides a method for adapting a charging profile to an individual usage of an appliance battery and also a device.

Further configurations are specified in the dependent claims.

According to a first aspect, a method is provided for carrying out a process for charging an appliance battery of an appliance, with the following steps:

providing a charging profile that specifies a maximally permissible charging current for charging the appliance battery in a manner depending on a state of charge of the appliance battery;

ascertaining a current state of health of the appliance battery;

providing a reference state of health that predetermines a customary state of health for a calendrical age of the appliance battery;

charging the appliance battery in a manner depending on a corrected maximally permissible charging current, the corrected maximally permissible charging current being ascertained by applying a correction value to the maximally permissible charging current, the correction value being determined in a manner depending on a correction function, depending on a difference between the reference state of health and the current state of health.

For appliance batteries up until now, one or more charging profiles are permanently predetermined, which are selected in accordance with the requirements such as, for instance, normal charging or fast charging. The charging profiles are conventionally applied to all appliance batteries of the same type. Depending on usage, in the case of frequent fast charging the appliance battery can be loaded considerably thereby, so that it displays an accelerated aging behavior. However, it is desirable to assimilate the aging behaviors of appliance batteries of the same type to one another, so that they display comparable lifespans or the warranty conditions predetermined by the manufacturer are complied with.

For this purpose, the above method provides for evaluating a reference state of health and for adapting a charging profile in accordance with the current state of health and the reference state of health of the other appliance batteries. The charging profile predetermines a maximum charging current for a state of charge of the appliance battery.

The reference state of health may have been predetermined or may have been determined by a mean/average state of health of appliance batteries of the same or comparable (within a predetermined tolerance range) calendrical age (period of time since initial operation of the new—that is to say, previously unused—appliance battery). This state of health may result from an evaluation of aging behaviors of a plurality of appliance batteries of the same type.

The reference state of health can also be ascertained with the aid of laboratory measurements, in the course of which the appliance battery is operated with permitted usage profiles and under permitted environmental conditions, so that the warranty conditions of the appliance battery can be complied with. Such battery conditions stipulate, for instance, that within eight years an appliance battery is to degrade only to a predetermined state of health of, for example, 80% SOH-C. The progression of the respective reference state of health over the calendrical age is then dependent on, or corresponds to, a progression of states of health that results in the case of constant usage of the appliance battery over the predetermined desired lifespan of the appliance battery and that attains the predetermined end-of-life state of health, which marks the end of life of the appliance battery, after the predetermined desired lifespan.

The state of health (SOH) in the case of appliance batteries is the key variable for indicating a remaining battery capacity or remaining proportional range at full battery charge. The state of health represents a measure of the aging of the appliance battery. In the case of an appliance battery or battery module or battery cell, the state of health can be specified as the capacity-retention rate (SOH-C). The capacity-retention rate SOH-C is specified as the ratio of the measured instantaneous capacity to an initial capacity of the fully charged battery. Alternatively, the state of health can be specified as the rise in internal resistance (SOH-R) with respect to an internal resistance at a start of the lifespan of the appliance battery. The relative change in internal resistance SOH-R rises with increasing aging of the battery. In the following, it will be assumed that the state of health of an appliance battery is poorer, the further the degradation of the appliance battery has progressed.

There may be provision that the correction value is determined in such a way that the maximally permissible charging current is reduced if the current state of health indicates a greater aging with respect to the reference state of health, and/or that the maximally permissible charging current is increased if the current state of health indicates a slighter aging with respect to the reference state of health.

According to the above method, the charging currents predetermined by the charging profile are reduced if the current state of health of the appliance battery in question, relative to the calendrical age, is better (less aging) than the average state of health of the plurality of appliance batteries of the same or comparable calendrical age, and the charging currents predetermined by the charging profile are increased if the state of health of the appliance battery in question, relative to the calendrical age, is poorer (greater aging) than the average state of health of the plurality of appliance batteries of the same or comparable calendrical age. If, for instance, after three years since initial operation the state of health of 90% SoH is ascertained as average state of health of the plurality of appliance batteries, then in the case of a current state of health of 91% of a certain appliance battery with a calendrical aging of three years the charging profile can be adapted in such a way that a higher loading in the course of charging is accepted.

Correspondingly, there is provision that the charging profile is adapted successively, depending upon the ascertained current state of health of the appliance battery in question. As a result, it is ensured that the loading of the appliance battery in the course of a charging process is lessened if the appliance battery is subject to an above-average degradation as a result of its usage, and conversely.

By virtue of the adaptation of the loading of the appliance battery, the residual lifespan of the appliance battery can be adapted up to a defined end of life. The end of life may indicate a point in time at which the state of health falls below a predetermined threshold value that indicates the end of life and that corresponds, for example, to a manufacturer's warranty limit.

With the aid of currently ascertained states of health, the charging profiles of appliance batteries are consequently adjusted individually, so that in each instance a compromise between charging convenience and the compliance with, or the attaining of, the desired lifespan of the appliance battery, predetermined by the manufacturer, succeeds as optimally as possible.

The method is executed automatically and can be executed only on the basis of the current state of health of the appliance battery in question.

The objective of the above method consists in adapting the charging profile appropriately in a manner depending on the current state of health of an appliance battery in such a way that in the further progression of the aging of the appliance battery the respective state of health approaches the reference state of health.

In principle, the reference state of health that is relevant for the current calendrical age of the appliance battery may have been predetermined with regard to various target criteria. Accordingly, this state of health may have been determined in accordance with a progression of the state of health in the case of average and, in particular, uniform loading over an intended period of usage (desired lifespan) in such a way that after the period of usage a predetermined state of health, such as, for example, 80% SOH, is attained. Alternatively, the reference state of health that is relevant for the current calendrical age of the appliance battery can be communicated to the appliance prior to the charging process from a central unit external to the appliance, depending on permitted operating-variable progressions of the plurality of appliance batteries on the basis of laboratory measurements. For this purpose, the reference state of health can be determined in a manner depending on the states of health of other appliance batteries in such a way that by virtue of the adaptation of the charging profile the aging behaviors of the appliance batteries are assimilated to one another or determined in the direction of a predetermined distribution.

Furthermore, the correction value may take the form of a correction factor for multiplicative application to the maximally permissible charging current, the correction function exhibiting a PT1 characteristic with respect to the difference between the reference state of health and the current state of health.

There may be provision that the charging of the appliance battery is carried out in accordance with a manual selection by a user in a manner depending either on the corrected maximally permissible charging current or on the maximally permissible charging current predetermined by the charging profile.

According to a further aspect, a device is provided for carrying out one of the above methods.

BRIEF DESCRIPTION OF THE DRAWINGS

Embodiments will be elucidated in more detail below with the aid of the appended drawings.

FIG. 2 shows a flowchart for illustrating a method for operating a vehicle battery during a charging process;

DETAILED DESCRIPTION

In the following, the method according to the invention will be described with reference to vehicle batteries by way of appliance batteries in a plurality of motor vehicles by way of homogeneous appliances. The state-of-health model can be operated in a central unit and can be employed for calculating and predicting aging.

The above example is representative of a plurality of stationary or mobile appliances with grid-independent power supply, such as, for instance, vehicles (electric vehicles, pedelecs, etc.), installations, machine tools, household appliances, IoT appliances and such like, which are in communication with a central unit (cloud) external to the appliance via an appropriate communications link (for example, LAN, Internet).

Figure 1:
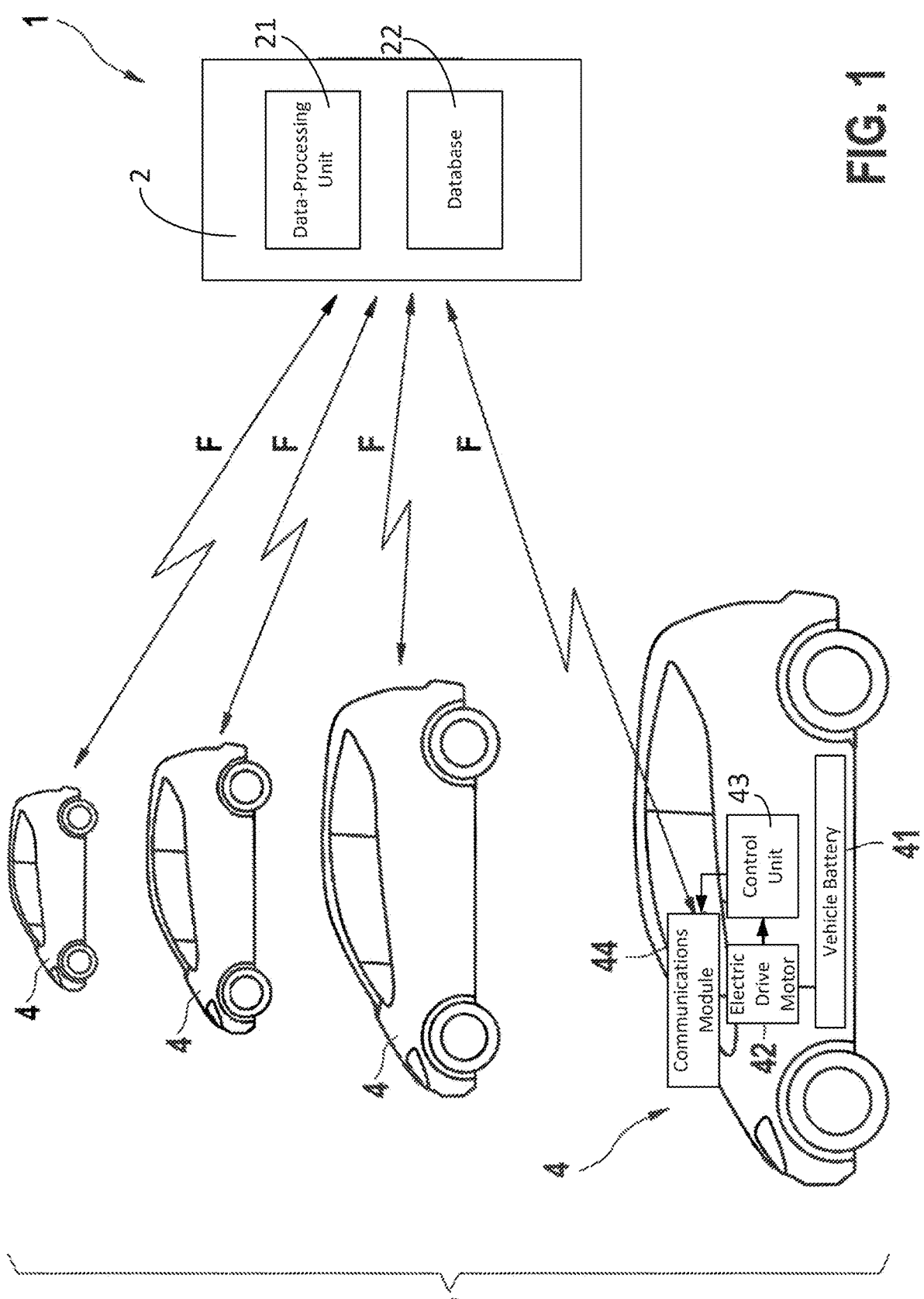
FIG. 1 shows a schematic representation of a system for providing driver-specific and vehicle-specific operating variables for determining a state of health of a vehicle battery in a central unit.

FIG. 1 shows a system 1 for collecting fleet data in a central unit 2 for the purpose of creating and for operating and also for evaluating a state-of-health model. The state-of-health model serves for determining a state of health of an electrical energy-storage device such as, for example, a vehicle battery or a fuel cell in a motor vehicle. FIG. 1 shows a vehicle fleet 3 with several motor vehicles 4.

One of the motor vehicles 4 has been represented in more detail in FIG. 1. The motor vehicles 4 each exhibit a vehicle battery 41 by way of rechargeable electrical energy-storage device, an electric drive motor 42 and a control unit 43. The control unit 43 is connected to a communications module 44 that is suitable to transmit data between the respective motor vehicle 4 and a central unit 2 (a so-called cloud).

The motor vehicles 4 send to the central unit 2 the operating variables F which specify at least variables that influence the state of health of the vehicle battery 41. In the case of a vehicle battery, the operating variables F may be time series of a battery current, of a battery voltage, of a battery temperature and of a state of charge (SOC), at pack level, module level and/or cell level. The operating variables F are captured in a fast time-slot pattern of 1 Hz to 100 Hz and can be transmitted regularly to the central unit 2 in uncompressed and/or compressed form.

Furthermore, the time series can be transmitted to the central unit 2 block-by-block at intervals from several hours to several days, using compression algorithms for the purpose of minimizing the data traffic to the central unit 2.

The central unit 2 exhibits a data-processing unit 21, in which the method described below can be executed, and a database 22 for storing data points, model parameters, states and such like.

A state-of-health model, which may be data-based, is implemented in the central unit 2. The state-of-health model can be used regularly—that is to say, for example, after the respective evaluation period has elapsed—in order to undertake an ascertainment of the instantaneous state of health of the vehicle battery 41 in question on the basis of the temporal progressions of the operating variables (in each instance since initial operation of the respective vehicle battery) and operating features ascertained therefrom.

The state of health (SOH) is the key variable for indicating a remaining battery capacity or remaining battery charge. The state of health represents a measure of the aging of the vehicle battery or of a battery module or of a battery cell and can be specified as the capacity-retention rate (SOH-C) or as the rise in internal resistance (SOH-R). The capacity-retention rate SOH-C is specified as the ratio of the measured instantaneous capacity to an initial capacity of the fully charged battery. The relative change in internal resistance SOH-R rises with increasing aging of the battery.

In an advantageous embodiment, the operating features can also be generated close to a sensor—that is to say, in the respective motor vehicle 4—so that the data transfer to the central unit 2 can be optimized.

Compression algorithms can be utilized, as for the time series, for transmission for the purpose of minimizing the data traffic to the central unit 2. Furthermore, an event-based transmission can take place, so that the data transfer is triggered and occurs if, for example, a stable or known WLAN network connection has been identified.

Figure 3:
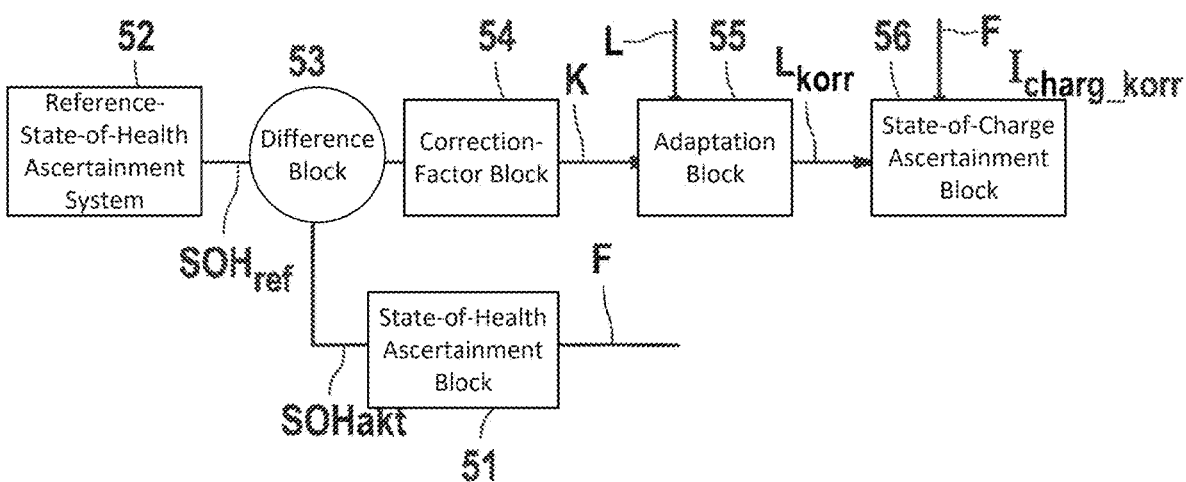
FIG. 3 shows a function-block representation of the function for carrying out a charging process for a vehicle battery.

FIG. 2 illustrates, with the aid of a flowchart, the method for carrying out a charging process on the basis of a charging profile. A function-block diagram for carrying out the method is represented in FIG. 3.

Figure 4:
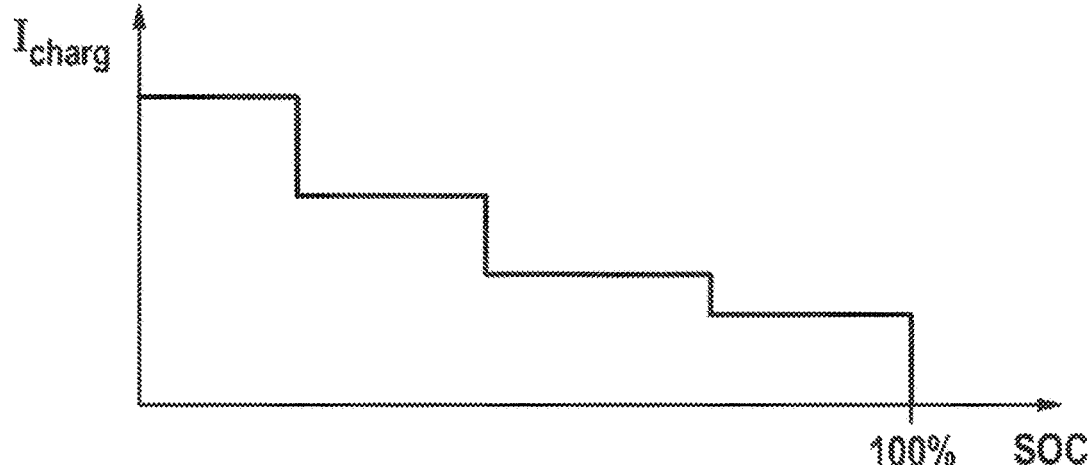
FIG. 4 shows a representation of a charging profile that specifies a progression of the charging current over the state of charge.

An optimized charging profile for a certain type of a vehicle battery 41 is, as a rule, predetermined by the manufacturer and specifies a maximally permissible charging current $I_{charg}$ over a certain state of charge SOC. An exemplary charging profile is represented in FIG. 4. The state of charge SOC corresponds generally to a stored charge in the battery, relative to the overall storage capacity of the vehicle battery 41. As a rule, a charging profile is ordinarily predetermined for ranges of state of charge, so a step-shaped profile is represented. As a rule, the permissible maximum charging current $I_{charg}$ decreases with increasing state of charge SOC.

The method for operating a charging process for a vehicle battery 41 firstly provides, in step S1, for checking whether a charging process is to be carried out. If this is the case (alternative "Yes"), the method is continued with step S2; otherwise the method branches back to step S1.

In step S2, a current state of health SOHakt of the vehicle battery 41 is ascertained in a state-of-health ascertainment block 51. Diverse state-of-health models may have been provided for this purpose, which can be executed in the vehicle, in particular by the battery management system, or even centrally in the central unit 2. The ascertainment of the current state of health SOHakt takes into account the battery behavior which is determined with the aid of the operating-variable progressions F.

In principle, several types of state-of-health model are known for use for the purpose of ascertaining a state of health of an electrical energy-storage device. For instance, the ascertainment of a state of health of an electrical energy-storage device can be undertaken with the aid of a physical state-of-health model or with the aid of a hybrid state-of-health model with a data-based correction model.

State-of-health models for ascertaining states of health for electrical energy-storage devices can be provided in the form of a hybrid state-of-health model—that is to say, a combination of a physical aging model with a data-based model. In the case of a hybrid model, a physical state of health can be ascertained with the aid of a physical or electrochemical aging model, and said state of health can have a correction value applied to it that results from a data-based correction model, in particular by addition or multiplication. The physical aging model is based on electrochemical-model equations that characterize electrochemical states of a non-linear differential-equation system, continuously calculate them and map them to the physical state of health for output as SOH-C and/or as SOH-R.

An alternative model for determining the state of health of batteries is constituted by the so-called base model. Here, a state-of-health value can be determined on the basis of the capacity-retention rate (SOH-C) with the aid of a coulomb counting method. For this purpose, with the aid of the temporal progressions of the operating variables it is detected that a charging process is being carried out. The charging process can, for instance, be detected if, starting from a state of total discharge of the battery (this can be detected in the case of batteries if an end-of-discharge voltage has been attained), a supply of a constant current occurs. The charging process can consequently be established on the basis of a constant flow of current into the vehicle battery. When the charging process has proceeded as far as full charging, the quantity of charge supplied to the vehicle battery overall can be determined by integrating the flow of current into the battery. This maximum quantity of charge can be assigned to a state-of-health value by comparison with a nominal charging capacity of the battery. Partial charging operations, with defined supply of charge, and corresponding measurements of the cell voltages before and after the partial charging can also be evaluated, in order to determine the state-of-health value on the basis of the capacity-retention rate. Furthermore, coulomb counting can also be carried out in the case of discharging processes—for instance, during a driving cycle—by a quantity of charge draining away being determined and by the cell voltages before and after the partial charging being evaluated.

The determination of the state of health with the aid of the base model is event-triggered, so, as a rule, a model value of the state of health is available only at irregular times. The base model can likewise be executed in the vehicle or in the central unit.

In step S3, in addition a reference state of health SOHref is predetermined by a reference-state-of-health ascertainment block 52. The reference state of health SOHref may, for instance, be permanently predetermined or may correspond to an average state of health of the vehicle batteries 41 of all the vehicles 4 of the vehicle fleet 3 with the same calendrical state of health—that is to say, with the same age relative to an initial-operation time. For the purpose of ascertaining the average state of health, all the vehicles 4 of the vehicle fleet 3 can communicate the corresponding states of health to the central unit 2 and/or can communicate the operating-variable data to the central unit 2, as previously described, so that the central unit 2 can accordingly determine states of health for the vehicle battery 41 in accordance with the models described above. The reference-state-of-health ascertainment block 52 is consequently preferentially implemented in the central unit 2.

By way of vehicles with the same calendrical aging, in particular all those vehicle batteries can be taken into account which, within a temporal tolerance range, exhibit a certain calendrical age corresponding to the vehicle battery 41 in question. For instance, the states of health of all the vehicle batteries 41 with a calendrical age of two years can be taken into account for the purpose of calculating the average state of health.

For the vehicle batteries 41 taken into account in this way, the corresponding actual states of health SOH are averaged, in order to obtain the average state of health as reference state of health SOHref.

Depending on a difference between the reference state of health SOHref and the current state of health SOHakt of the vehicle battery 41 in question, which is determined in a difference block 53, a correction factor K is now ascertained in a correction-factor block 54 in step S4, in particular with the aid of a predetermined correction-factor function that predetermines a correction factor K of less than 1 in the case of a positive difference between the reference state of health SOHref and the current state of health SOHakt, and a correction factor K of greater than 1 in the case of a negative difference.

This correction factor is now used in step S5 in an adaptation block 55, in order to adapt (multiplicatively) the maximum charging currents predetermined in each instance by the predetermined charging profile L, in order to obtain a corrected charging profile $L_{korr}$.

Subsequently, the charging current currently to be set, or a corrected maximally permissible charging current $I_{charg\_korr}$, can be ascertained in step S6 on the basis of a determination of the current state of charge SOC in the respective vehicle battery in a state-of-charge ascertainment block 56, and in the charging process the charging current can be set to the corrected maximally permissible charging current.

In this way, an excessive scattering of the progressions of the states of health of the vehicle batteries in a vehicle fleet can be reduced, and the aging behaviors can be adapted to the predetermined reference aging behavior or to an average aging behavior of the vehicle batteries.

The method can be executed in whole or in part in the central unit. In particular, the ascertainment of the states of health of the vehicle battery 41 of the reference state of health SOHref is preferentially executed in the central unit 2.

Furthermore, the ascertainment of the correction factor and the adaptation of the charging profile can likewise be executed in the central unit 2. The charging profile or the correction factor is communicated in this case to the vehicle in question for the purpose of being taken into account in the course of a corresponding charging process.

Alternatively, it may also be sufficient to transmit merely the reference state of health SOHref for the calendrical age of the vehicle battery 41 in question to the corresponding vehicle 4, so that the communication of the correction factor K and the adaptation of the predetermined charging profile L can be undertaken in the vehicle 4 or, to be more precise, in a battery management system of the vehicle battery 41. In particular, there may be provision that an adaptation of the charging profile L is carried out only when the difference between the reference state of health SOHref and the current state of health SOHakt exceeds a predetermined threshold value.

The correction function is chosen in such a way that a resulting maximum charging current corresponding to the corrected charging profile does not become so high that it lies outside the specification for the vehicle battery 41 in question and may constitute a safety risk for the vehicle battery. On the other hand, the correction factor should not be so low that the charging period during the charging process becomes disproportionately long. By way of progression of the correction function, use may be made of a progression corresponding to a PT1 behavior, so that in the case of small differences between the reference state of health SOHref and the current state of health SOHakt only a slight correction of the charging profile is sufficient to avoid an overshoot in the further progression of the state of health of the vehicle battery in question.

There may furthermore be provision that the application of the correction factor is enabled or disabled by a corresponding manual selection by a user.

The invention claimed is:

1. A method for charging an appliance battery (41) of an appliance, the method comprising the following steps:

providing a charging profile that specifies a maximally permissible charging current for charging the appliance battery (41) depending on a state of charge of the appliance battery;

ascertaining (S2) a current state of health (SOHakt) of the appliance battery (41);

providing (S3) a reference state of health that predetermines a customary state of health for a calendrical age of the appliance battery (41); and charging (S6) the appliance battery (41) in a manner depending on a corrected maximally permissible charging current, the corrected maximally permissible charging current being ascertained (S4) by applying a correction value (K) to the maximally permissible charging current, the correction value (K) being determined in a manner depending on a correction function, depending on a difference between the reference state of health (SOHref) and the current state of health (SOHakt), wherein the correction value (K) takes the form of a correction factor for multiplicative application to the maximally permissible charging current, the correction function exhibiting a PT1 characteristic with respect to the difference between the reference state of health (SOHref) and the current state of health (SOHakt).

2. The method according to claim 1, wherein the reference state of health (SOHref) is determined as a mean/average state of health of a plurality of appliance batteries (41) of the same type with the same or comparable calendrical age.

3. The method according to claim 2, wherein the reference state of health (SOHref) is ascertained in a central unit (2) external to the appliance in a manner depending on operating-variable progressions of the plurality of appliance batteries (41) and is communicated to the appliance prior to the charging process.

4. The method according to claim 1, wherein the correction value (K) is determined in such a way that the maximally permissible charging current is reduced if the current state of health (SOHakt) indicates a greater aging with respect to the reference state of health (SOHref), and/or that the maximally permissible charging current is increased if the current state of health (SOHakt) indicates a slighter aging with respect to the reference state of health (SOHref).

5. The method according to claim 1, wherein the charging of the appliance battery (41) is carried out in accordance with a manual selection by a user in a manner depending either on the corrected maximally permissible charging current or on the maximally permissible charging current predetermined by the charging profile.

6. A computer comprising an electronic processor configured to provide a charging profile that specifies a maximally permissible charging current for charging an appliance battery (41) depending on a state of charge of the appliance battery;

ascertain (S2) a current state of health (SOHakt) of the appliance battery (41);

provide (S3) a reference state of health that predetermines a customary state of health for a calendrical age of the appliance battery (41); and control charging (S6) of the appliance battery (41) in a manner depending on a corrected maximally permissible charging current, the corrected maximally permissible charging current being ascertained (S4) by applying a correction value (K) to the maximally permissible charging current, the correction value (K) being determined in a manner depending on a correction function, depending on a difference between the reference state of health (SOHref) and the current state of health (SOHakt), wherein the correction value (K) takes the form of a correction factor for multiplicative application to the maximally permissible charging current, the correction function exhibiting a PT1 characteristic with respect to the difference between the reference state of health (SOHref) and the current state of health (SOHakt).

7. A non-transitory, computer-readable medium containing instructions which, when executed by at a computer, cause the computer to:

provide a charging profile that specifies a maximally permissible charging current for charging an appliance battery (41) depending on a state of charge of the appliance battery;

ascertain (S2) a current state of health (SOHakt) of the appliance battery (41);

provide (S3) a reference state of health that predetermines a customary state of health for a calendrical age of the appliance battery (41); and control charging (S6) of the appliance battery (41) in a manner depending on a corrected maximally permissible charging current, the corrected maximally permissible charging current being ascertained (S4) by applying a correction value (K) to the maximally permissible charging current, the correction value (K) being determined in a manner depending on a correction function, depending on a difference between the reference state of health (SOHref) and the current state of health (SOHakt), wherein the correction value (K) takes the form of a correction factor for multiplicative application to the maximally permissible charging current, the correction function exhibiting a PT1 characteristic with respect to the difference between the reference state of health (SOHref) and the current state of health (SOHakt).

* * * * *